United States Patent
Golov

(10) Patent No.: US 11,657,865 B2
(45) Date of Patent: *May 23, 2023

(54) DYNAMIC MEMORY REFRESH INTERVAL TO REDUCE BANDWIDTH PENALTY

(71) Applicant: Micron Technology, Inc., Boise, ID (US)

(72) Inventor: Gil Golov, Backnang (DE)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/149,709

(22) Filed: Jan. 14, 2021

(65) Prior Publication Data

US 2021/0134356 A1    May 6, 2021

Related U.S. Application Data

(63) Continuation of application No. 16/010,211, filed on Jun. 15, 2018, now Pat. No. 10,896,715.

(51) Int. Cl.
*G11C 11/406* (2006.01)
*G06F 3/06* (2006.01)

(52) U.S. Cl.
CPC ...... *G11C 11/40615* (2013.01); *G06F 3/0619* (2013.01); *G06F 3/0653* (2013.01); *G06F 3/0673* (2013.01)

(58) Field of Classification Search
CPC .... G06F 3/0619; G06F 3/0653; G06F 3/0673; G11C 11/40615
See application file for complete search history.

(56) References Cited

U.S. PATENT DOCUMENTS

| | | | |
|---|---|---|---|
| 6,385,113 B1 | 5/2002 | Longwell et al. | |
| 9,055,711 B2* | 6/2015 | Saito | G06F 11/3409 |
| 10,896,715 B2 | 1/2021 | Golov | |
| 2006/0083094 A1* | 4/2006 | Sinha | G11C 11/40626 365/222 |
| 2011/0044119 A1 | 2/2011 | Walker | |
| 2011/0231601 A1 | 9/2011 | Pattabiraman et al. | |
| 2013/0128682 A1 | 5/2013 | Henderson et al. | |
| 2014/0254298 A1* | 9/2014 | Dally | G11C 11/40626 365/222 |
| 2015/0143198 A1 | 5/2015 | Chun et al. | |
| 2019/0006001 A1 | 1/2019 | Chun et al. | |
| 2019/0385666 A1 | 12/2019 | Golov | |

OTHER PUBLICATIONS

Title: Dynamic Memory Refresh Interval to Reduce Bandwidth Penalty, U.S. Appl. No. 16/010,211, filed Jun. 15, 2018, Inventor: Gil Golov, Status: Patented Case, Status Date: Dec. 29, 2020.
"Dynamic random-access memory", Wikipedia, printed on May 29, 2018.

* cited by examiner

*Primary Examiner* — Aracelis Ruiz
(74) *Attorney, Agent, or Firm* — Greenberg Traurig

(57) ABSTRACT

A dynamic memory system having multiple memory regions respectively storing multiple types of data. A controller coupled to the dynamic memory system via a communication channel and operatively to: monitor usage of a communication bandwidth of the communication channel; determine to reduce memory bandwidth penalty caused by refreshing the dynamic memory system; and in response, reduce a refresh rate of at least one of the memory regions based on a type of data stored in the respective memory region.

3 Claims, 4 Drawing Sheets

DYNAMIC MEMORY REFRESH INTERVAL TO REDUCE BANDWIDTH PENALTY

RELATED APPLICATIONS

The present application is a continuation application of U.S. patent application Ser. No. 16/010,211, filed Jun. 15, 2018, issued as U.S. Pat. No. 10,896,715 on Jan. 19, 2021 and entitled "Dynamic Memory Refresh Interval to Reduce Bandwidth Penalty" the entire disclosure of which is hereby incorporated herein by reference.

FIELD OF THE TECHNOLOGY

At least some embodiments disclosed herein relate to memory systems in general, and more particularly, reduction of bandwidth penalty using dynamic memory refresh intervals.

BACKGROUND

Dynamic memories, such as Dynamic Random Access Memory (DRAM), use memory units where the quality of information stored in the memory units can degrade in a short period of time even when the memory units are continuously powered.

For example, DRAM has capacitors integrated in an integrated circuit. A capacitor in a memory unit of DRAM can be charged or discharged to represent respectively two different values of a bit. However, the electric charge on such a capacitor can leak off, resulting in degradation of the quality of the information stored in the memory unit. After a period of time, charge leakage may cause the capacitor of the memory unit to appear discharged, even though the capacitor is charged before the period of time. Thus, the charge leakage can change the value stored in the memory unit and thus cause data corruption.

To prevent data corruption, a memory refresh circuit can be used to periodically refresh the data stored in the DRAM. To refresh the data, the memory refresh circuit causes the reading of the stored data from the DRAM and re-writes the data back to the DRAM. Thus, the capacitors of the memory units can be charged or discharged periodically according to the data stored in the memory units to prevent data corruption.

Charge leakage can be a function of the temperature of the memory device. The capacitors of DRAM memory units can retain charge longer at low temperatures. Under some conditions most of the data in DRAM can be recovered without being refreshed for several minutes. However, to guarantee recovery of the stored data, DRAM is typically refreshed at a short time interval, such as 64 milliseconds.

BRIEF DESCRIPTION OF THE DRAWINGS

The present disclosure will be understood more fully from the detailed description given below and from the accompanying drawings of various embodiments of the disclosure.

DETAILED DESCRIPTION

At least some aspects of the present disclosure are directed to the reduction of memory refresh rate based on error tolerance characteristics of the data stored in the memory.

Refreshing memory can cause a memory bandwidth penalty. For example, when an external DRAM controller sends to a DRAM device a refresh command to refresh a bank of DRAM memory units, the DRAM cannot deliver data during the time period of memory refreshing operations. A higher temperature requires a higher refresh rate, which cause even higher degradation of DRAM bandwidth performance. Failing to refresh the DRAM at a recommended refresh rate increases the probability of error/data corruption.

At least some aspects of the present disclosure address the above and other deficiencies by selectively reducing refresh rates of memory portions based on the error tolerance characteristics of the data stored in the memory. For example, an external DRAM controller can use different refresh rates for different banks of memory units to allow trade-off between performance and probability of error/data corruption.

For example, data that is less sensitive to error/corruption can be refreshed at a rate lower than for data that is sensitive to error/corruption. Refreshing at a lower frequency can reduce bandwidth penalty caused by memory refreshing operations and improve memory access performance.

For instance, graphics and music can be stored on a DRAM of an infotainment system. The use of such graphics and music in the infotainment system can be insensitive to a few isolated errors. Thus, the banks of DRAM memory units that store such error-insensitive information can have a relaxed refresh rate with lower bandwidth penalty. However, software code and variables can be very sensitive to error/corruption. Thus, banks of DRAM memory units that store such error-insensitive information can have a higher refresh rate, with higher bandwidth penalty, to ensure data reliability.

Figure 1:
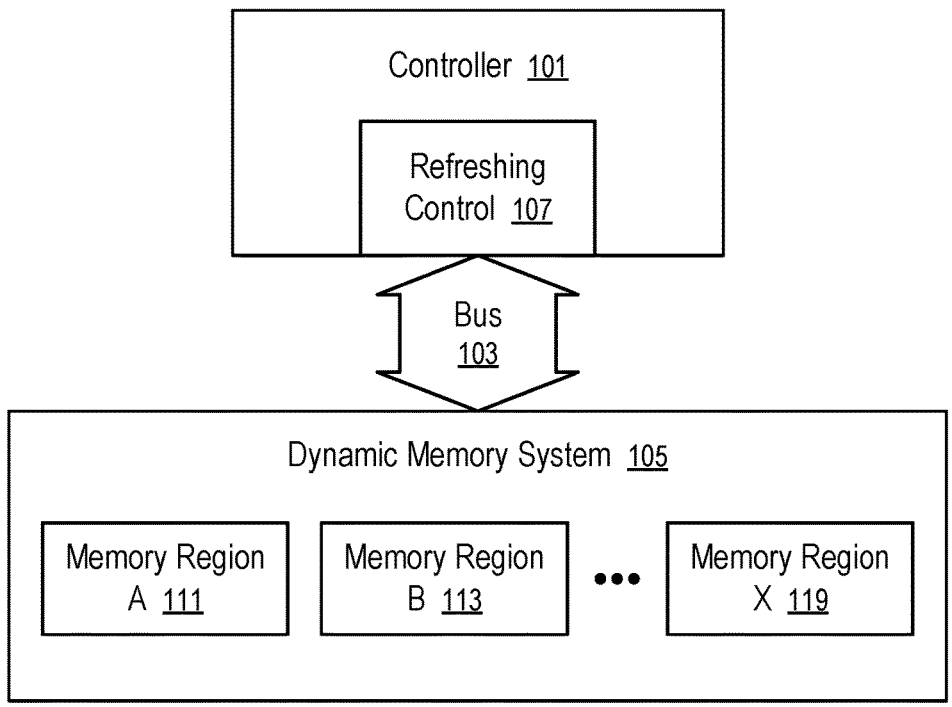
FIG. 1 illustrates an example memory system having a refreshing control in accordance with some embodiments of the present disclosure.

FIG. 1 illustrates an example memory system having a refreshing control 107 in accordance with some embodiments of the present disclosure.

In FIG. 1, a controller 101 has the refreshing control 107 that can send refresh commands to a dynamic memory system 105 over a bus 103.

The dynamic memory system 105 can have separate memory regions 111, 113, . . . , 119 that can be separately refreshed. For example, each memory region 111, 113, . . . , 119 can include one or more banks of memory units; and the refresh control 107 can send a refresh command through the bus 103 to each bank of memory units to refresh the respective bank of memory units. When the refresh command is transmitted to the bank of the memory units, at least the bank of the memory units is not usable to read or write data in individual memory units until the refreshing operations in the bank are completed.

For example, the memory units in the dynamic memory system 105 can be DRAM memory cells that are periodically refreshed to avoid data corruption caused by charge leak.

Preferably, data of different types is stored in different memory regions 111, 113, . . . , 119, such that the refresh rates of the memory regions 111, 113, . . . , 119 can be customized based on the error tolerance characteristics of the data stored in the memory regions 111, 113, . . . , 119 and/or the bandwidth demands.

Figure 2:
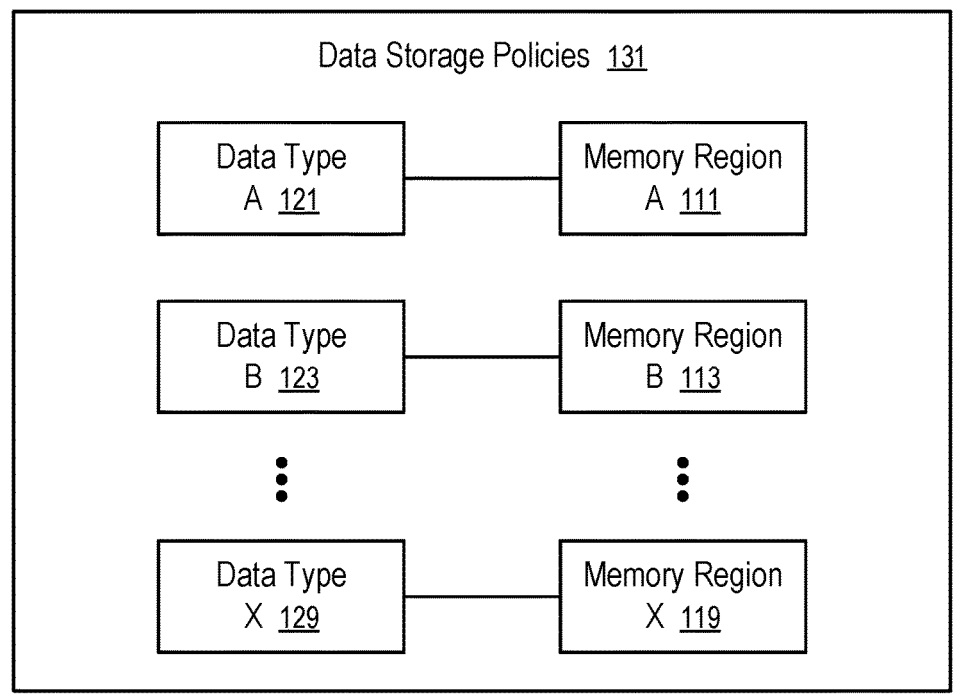
FIG. 2 illustrates an example of data storage policies in accordance with some embodiments of the present disclosure.

For example, data can be stored in the memory regions 111, 113, . . . , 119 using the data storage policies 131 illustrated in FIG. 2

FIG. 2 illustrates an example of data storage policies 131 in accordance with some embodiments of the present disclosure.

For example, memory regions 111, 113, . . . , 119 are associated with data types 121, 123, . . . , 129 respectively. Examples of different data types include software, variables, graphics/images of graphical user interface (GUI), icons, music, video, etc.

In general, different data types 121, 123, . . . , 129 can have different data reliability requirements. For example, different thresholds of error/corruption probabilities can be specified for different data types. When data of a given type is refreshed such that the probability of error/correction in the data is below its threshold, the refreshing can be considered sufficient. Thus, the data refresh rates of the memory regions 111, 113, . . . , 119 can be determined from the thresholds of error/corruption probabilities of the data types 121, 123, . . . , 129.

For example, the dynamic memory system 105 can have one or more temperature sensors that measure the temperature(s) of the memory regions 111, 113, . . . , 119. At a given temperature, the error/corruption probability of a memory unit is a function of the refresh rate. The higher the refresh rate, the lower the error/corruption probability of the memory unit. When the refreshing rate is higher than a particular value, the memory unit can be considered to be guaranteed to be error free. Thus, for a threshold of error/corruption probability that is accepted for the data stored in the memory unit, a threshold refresh rate can be determined; and the memory unit can be refreshed at the threshold refresh rate for the temperature, or higher, to ensure that the reliability requirement of the data stored in the memory unit is met.

Figure 3:
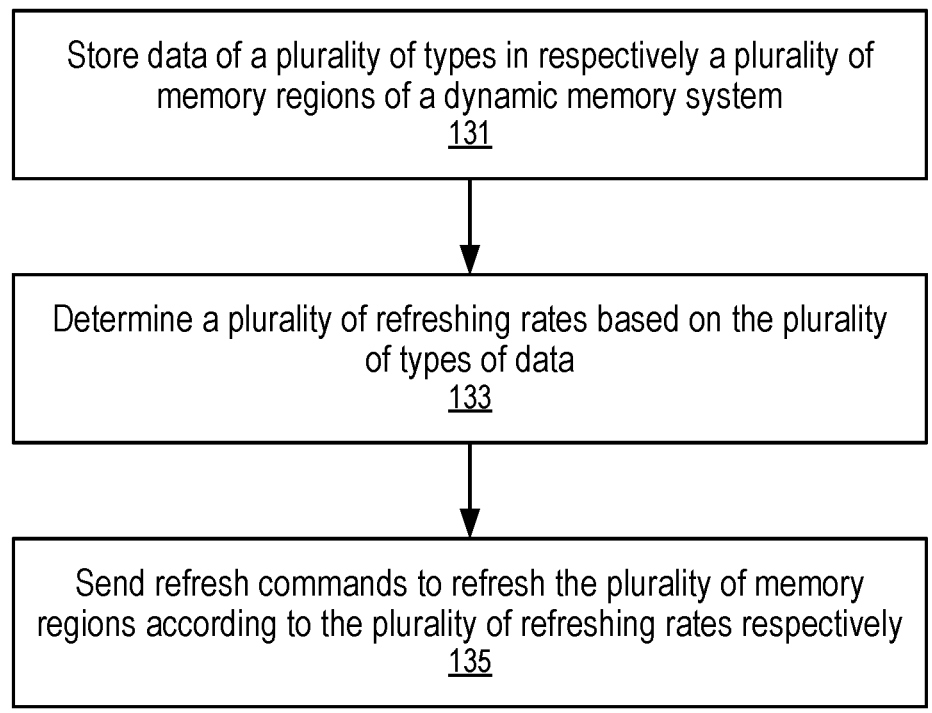
FIG. 3 is a flow diagram of an example method to control refreshing of a memory system in accordance with some embodiments of the present disclosure.

FIG. 3 is a flow diagram of an example method to control refreshing of a memory system in accordance with some embodiments of the present disclosure. For example, the method of FIG. 3 can be implemented in the system of FIG. 1 using the data storage policies of FIG. 2.

The method of FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 3 is performed at least in part by the refreshing control 107 and/or the controller 101 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 131, the controller 101 stores data of a plurality of types 121, 123, . . . , 129 in respectively a plurality of memory regions 111, 113, . . . , 119 of a dynamic memory system 105. For example, the types 121, 123, . . . , 129 can include application, variable, images, music, videos, etc. For example, the memory regions 111, 113, . . . , 119 can be separated as banks of memory units that can be refreshed separately.

At block 133, the refresh control 107 determines a plurality of refresh rates based on the plurality of types 121, 123, . . . , 129 of data. For example, at a given temperature of the dynamic memory system 105, the refresh control 107 determines the refresh rates of the data types 121, 123, . . . , 129 to meet the threshold error/corruption probability requirements of the data types 121, 123, . . . , 129.

For example, a predetermined look up table can be used to store the minimal refresh rates of the data types 121, 123, . . . , 129 at a set of temperatures. The look up table can be used to determine the minimal refresh rates of the data types 121, 123, . . . , 129 at the current operating temperature of the dynamic memory system 105.

For example, an empirical formula or a look up table can be used to represent the relation between a refresh rate and an expected error/corruption probability of a memory region refreshed at the refresh rate when the memory region is at a specific temperature. Thus, at the current temperature of the dynamic memory system 105 and for a given threshold of error/corruption probability, the refreshing control 107 can compute a minimum refresh rate that is required to meet the threshold of error/corruption probability. When the data types 121, 123, . . . , 129 have different thresholds of error/corruption probability, the refreshing control 107 can compute the different minimum refresh rates for the data types 121, 123, . . . , 129 at the current operating temperature of the dynamic memory system 105.

At block 135, the refresh control 107 sends refresh commands to refresh the plurality of memory regions 111, 113, . . . , 119 according to the plurality of refresh rates respectively determined for the data types 121, 123, . . . , 129.

Figure 4:
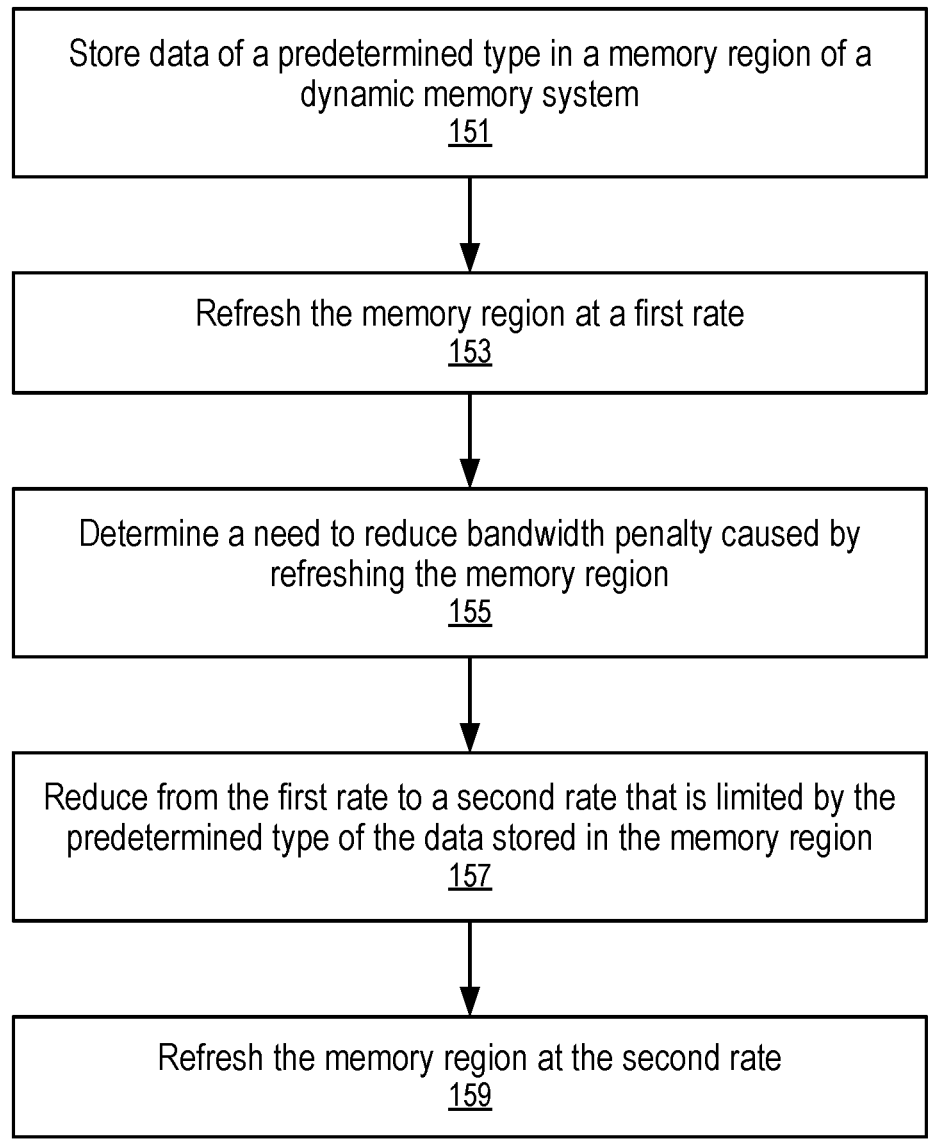
FIG. 4 is a flow diagram of another example method to control refreshing of a memory system in accordance with some embodiments of the present disclosure.

FIG. 4 is a flow diagram of an example method to control refreshing of a memory system in accordance with some embodiments of the present disclosure. For example, the method of FIG. 4 can be implemented in the system of FIG. 1 using the data storage policies of FIG. 2.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by the refreshing control 107 and/or the controller 101 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 151, the controller 101 stores data of a predetermined type 121, 123, . . . , or 129 in a memory region 111, 113, . . . , or 119 of a dynamic memory system 105.

At block 153, the refresh control 107 refreshes the memory region 111, 113, . . . , or 119 at a first rate. For example, the refresh control 107 can send refresh commands over the bus 103 to each bank of memory units in the memory region 111, 113, . . . , or 119 at a time interval determined by the first rate. For example, the first rate can be high enough that the data stored in the memory region 111, 113, ..., or 119 is considered to be guaranteed to be free of error/corruption.

At block 155, the refreshing control 107 determines a need to reduce bandwidth penalty caused by refreshing the memory region 111, 113, ..., or 119. For example, the refreshing control 107 can monitor the bandwidth usage of the memory region 111, 113, ..., or 119. When the reduction of bandwidth penalty can improve the memory access performance of the memory region 111, 113, ..., or 119 to meet the demand, the refreshing control 107 can implement reduction of the bandwidth penalty caused by memory refreshing.

At block 157, the refreshing control 107 reduces from the first rate to a second rate, where the second rate is limited by the predetermined type 121, 123, ..., or 129 of the data stored in the memory region 111, 113, ..., or 119. Different data types 121, 123, ..., and 129 allow different degrees of reduction. In some instances, the lowest acceptable refresh rate of the predetermined data type 121, 123, ..., or 129 is determined by the acceptable error/corruption probability that can be tolerated for the data of the predetermined type 121, 123, ..., or 129 for the current temperature of the memory region 111, 113, ..., or 119.

At block 159, the refresh control 107 refreshes the memory region 111, 113, ..., or 119 at the second rate.

When there is no need to reduce the bandwidth penalty caused by refreshing the memory region 111, 113, ..., or 119, the refreshing control 107 can return to refreshing the memory region 111, 113, ..., or 119 at the first rate.

In one aspect, the present disclosure includes a computing system that has a dynamic memory system 105 and a controller 101. The dynamic memory system 105 is configured to store a plurality of types 121, 123, ..., 129 of data in a plurality of memory regions 111, 113, ..., 119 respectively. The controller 101 is coupled to the dynamic memory system 105 via a communication channel, such as a bus 103, and is operatively to monitor usages of memory access bandwidth of memory regions 111, 113, ..., 119 to reach a decision to reduce memory bandwidth used by refreshing the dynamic memory system 105. In response to the decision, the controller 101 reduces a refresh rate of at least one of the plurality of memory regions based on a type of data stored in the one of the plurality of memory regions.

For example, each of the plurality of memory regions 111, 113, ..., 119 includes dynamic random access memory (DRAM); and the controller 101 refreshes a memory region 111, 113, ..., or 119 at a reduced rate to reduce the memory bandwidth used by refreshing the dynamic memory system 105.

In general, refreshing a memory location at a rate includes repeating a refreshing operation a time interval determined by the rate or frequency. The refreshing operation includes reading data from the memory location and writing the data back to the memory location.

For example, the controller 101 can refresh a first memory region 111 at a first frequency and refresh a second memory region 113 at a second frequency different from the first frequency. The first memory region 111 stores data of a first type 121; the second memory region 113 stores data of a second type 123; and the first frequency is lower than the second frequency when data of the first type 121 can tolerate a higher probability of error or data corruption than data of the second type 123. At a current operating temperature of the dynamic memory system 105, there can be a threshold frequency such that when a memory region 111, 113, ..., or 119 is refreshed at or above the threshold frequency, the data in the memory region 111, 113, ..., or 119 can be considered to be guaranteed to be free of error or corruption. Refreshing the memory region 111, 113, ..., or 119 below the threshold frequency can be insufficient to prevent data corruption. In some instances, the first frequency can be reduced to below the threshold frequency to tolerate a level of data corruption in exchange for performance gain resulting from the reduced refresh frequency. The second frequency can be no less than the threshold to fully prevent data corruption.

For example, the first data type 121 can be images, icons, music, or video that can tolerate a level of data corruption; and the second data type 123 can be instructions or variables that should be error free.

For example, the data of the first type 121 can represent media consumed a media player; and the data of the second type 123 can contain instructions and variables of applications.

In another aspect, the present disclosure includes a method in the computing system.

For example, the method can include identifying, by the controller 101 coupled to the dynamic memory system 105, a plurality of memory regions 111, 115, ... 119 in the dynamic memory system 105 as being used to store a plurality of types 121, 123, ..., 129 of data respectively. The method can further includes reaching a decision, by the controller 107, to reduce memory bandwidth of used to refresh the dynamic memory system 105 and in response to the decision, reducing, by the controller 101, a rate to refresh at least one memory region 111, 113, ..., or 119 based on a type 121, 123, ..., or 129 of data stored in the one memory region 111, 113, ..., or 119.

For example, the method can include sending, by the controller 101, refresh commands to the memory region 111, 113, ..., or 119 at a reduced rate. For example, a refresh command sent to the memory region 111, 113, ..., or 119 can cause the dynamic memory system 105 to read data from the memory region 111, 113, ..., or 119 and to write the data back to the memory region 111, 113, ..., or 119. For examples, the memory regions 111, 113, ..., and 119 can be separated by banks of memory units, where each bank is refreshed together. For example, each bank contains a set of memory cells of dynamic random access memory.

For example, the method can include partitioning memory in the dynamic memory system 105 into the plurality of regions 111, 113, ..., 119 for associated with the plurality of types 121, 123, ..., 129 of data. After the memory in the dynamic memory system 105 is partitioned according to the data types 121, 123, ..., 129, the method can further include storing data in the plurality of regions 111, 113, ..., 119 according to types 121, 123, ..., 129 of the data.

In one aspect, the present disclosure includes computing apparatuses performing any of the methods and non-transitory computer-readable storage media storing instructions that, when executed by a processing device, cause the processing device to perform any of the methods.

Figure 5:
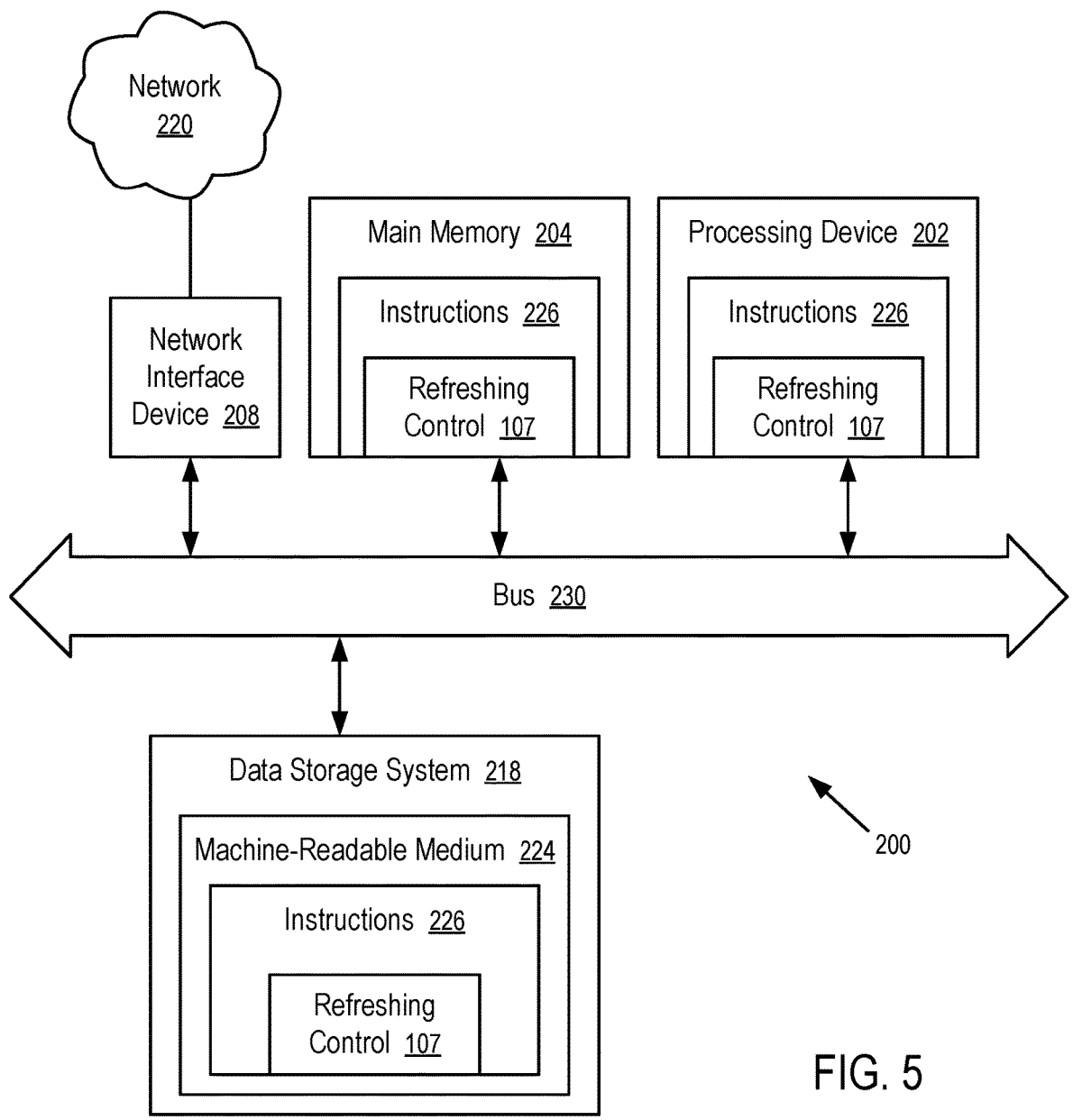
FIG. 5 is a block diagram of an example computer system in which embodiments of the present disclosure can operate.

FIG. 5 illustrates an example machine of a computer system 200 within which a set of instructions, for causing the machine to perform any one or more of the methodologies discussed herein, can be executed. In some embodiments, the computer system 200 can correspond to a host system that includes, is coupled to, or utilizes a dynamic memory system (e.g., the dynamic memory system 105 of FIG. 1) or can be used to perform the operations of a refreshing control 107 (e.g., to execute instructions to perform operations corresponding to the refresh control 107 described with reference to FIGS. 1-4). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 200 includes a processing device 202, a main memory 204 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 218, which communicate with each other via a bus 230 (which can include multiple buses).

Processing device 202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 202 can also be one or more special-purpose processing devices such as an application specific integrated circuit (ASIC), a field programmable gate array (FPGA), a digital signal processor (DSP), network processor, or the like. The processing device 202 is configured to execute instructions 226 for performing the operations and steps discussed herein. The computer system 200 can further include a network interface device 208 to communicate over the network 220.

The data storage system 218 can include a machine-readable storage medium 224 (also known as a computer-readable medium) on which is stored one or more sets of instructions 226 or software embodying any one or more of the methodologies or functions described herein. The instructions 226 can also reside, completely or at least partially, within the main memory 204 and/or within the processing device 202 during execution thereof by the computer system 200, the main memory 204 and the processing device 202 also constituting machine-readable storage media. The machine-readable storage medium 224, data storage system 218, and/or main memory 204 can correspond to the memory system 105 of FIG. 1.

In one embodiment, the instructions 226 include instructions to implement functionality corresponding to a refresh control 107 (e.g., the refresh control 107 described with reference to FIGS. 1-4). While the machine-readable storage medium 224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
identifying, by a controller coupled to a dynamic memory system via a communication channel, a plurality of dynamic random access memory regions in the dynamic memory system, the plurality of dynamic random access memory regions respectively storing a plurality of different types of data, wherein a first memory region in the plurality of memory regions stores a first type of data different from a second type of data stored in a second memory region, wherein the data of the first type represents media for a media player and the data of the second type contains instructions of applications, data of the first type being error tolerant than the data of the second type;
partitioning memory in the dynamic memory system into the plurality of regions pre- associated with the plurality of types of data;
storing data in the plurality of regions according to types of the data;
reaching a decision, by the controller, to reduce memory bandwidth used to refresh the dynamic memory system; and
in response to the decision, reducing, by the controller, a rate to refresh at least one of the plurality of memory regions based on a type of data stored in the one of the plurality of memory regions, including refreshing the first memory region at a first frequency, and refreshing the second memory region at a second frequency, wherein the first frequency is lower than the second frequency;
wherein the refreshing is performed by repeating a refreshing operation at a time interval determined by the reduced rate; and the refreshing operation includes:
reading data from a memory location; and
writing the data back to the memory location;
wherein the first frequency is below a threshold; the second frequency is no less than the threshold; and refreshing the dynamic memory system at the second frequency is sufficient to prevent data corruption; and refreshing the dynamic memory system at the first frequency is insufficient to prevent data corruption.

2. A system, comprising:
a dynamic memory system having a plurality of dynamic random access memory regions respectively storing a plurality of different types of data, wherein a first memory region in the plurality of memory regions stores a first type of data different from a second type of data stored in a second memory region, wherein the data of the first type represents media for a media player and the data of the second type contains instructions of applications, data of the first type being error tolerant than the data of the second type; and
a controller coupled to the dynamic memory system via a communication channel and operatively to:
monitor usages of memory access bandwidth of the plurality of memory regions;
determine to reduce memory bandwidth used by refreshing the dynamic memory system; and
reduce a refresh rate of at least one of the plurality of memory regions based on a type of data stored in the one of the plurality of memory regions, including refreshing the first memory region at a first frequency, and refreshing the second memory region at a second frequency, wherein the first frequency is lower than the second frequency;
wherein the refreshing is performed by repeating a refreshing operation at a time interval determined by the reduced rate; and the refreshing operation includes:
reading data from a memory location; and
writing the data back to the memory location;
wherein the first frequency is below a threshold; the second frequency is no less than the threshold; and refreshing the dynamic memory system at the second frequency is sufficient to prevent data corruption; and refreshing the dynamic memory system at the first frequency is insufficient to prevent data corruption.

3. A non-transitory computer-readable storage medium storing instructions that, when executed by a processing device, cause the processing device to perform a method, the method comprising:
partitioning memory of a dynamic memory system into a plurality of dynamic random access memory regions pre-associated with a plurality of different types of data;
storing data in the plurality of regions according to types of the data, wherein a first memory region in the plurality of regions stores a first type of data different from a second type of data stored in a second region, wherein the data of the first type represents media for a media player and the data of the second type contains instructions of applications, data of the first type being error tolerant than the data of the second type;
monitoring memory bandwidth usages of the dynamic memory system, wherein the controller refreshes the dynamic memory system;
determining to reduce bandwidth penalty caused by refreshing the dynamic memory system; and
reducing a refresh rate of at least one of the plurality of memory regions in accordance with a type of data stored in the one of the plurality of memory regions, including refreshing the first memory region at a first frequency, and refreshing the second memory region at a second frequency, wherein the first frequency is lower than the second frequency;
wherein the refreshing is performed by repeating a refreshing operation at a time interval determined by the reduced rate; and the refreshing operation includes:
reading data from a memory location; and
writing the data back to the memory location;
wherein the first frequency is below a threshold; the second frequency is no less than the threshold; and refreshing the dynamic memory system at the second frequency is sufficient to prevent data corruption; and refreshing the dynamic memory system at the first frequency is insufficient to prevent data corruption.

* * * * *